United States Patent
Jost et al.

[11] Patent Number: 6,153,527
[45] Date of Patent: *Nov. 28, 2000

[54] SEMICONDUCTOR PROCESSING METHOD OF MAKING ELECTRICAL CONTACT TO A NODE RECEIVED WITHIN A MASS OF INSULATING DIELECTRIC MATERIAL

[75] Inventors: Mark E. Jost; Phillip G. Wald, both of Boise, Id.

[73] Assignee: Micron Technology, Inc., Boise, Id.

[*] Notice: This patent is subject to a terminal disclaimer.

[21] Appl. No.: 09/441,718

[22] Filed: Nov. 16, 1999

Related U.S. Application Data

[63] Continuation of application No. 09/028,045, Feb. 23, 1998, Pat. No. 6,037,261, which is a continuation of application No. 08/595,595, Feb. 2, 1996, Pat. No. 5,739,068, which is a continuation-in-part of application No. 08/394,545, Feb. 22, 1995, Pat. No. 5,563,089.

[51] Int. Cl.⁷ .................................................. H01L 21/311
[52] U.S. Cl. ........................... 438/696; 438/702; 438/713
[58] Field of Search ..................................... 438/696, 702, 438/703, 713, 714

[56] References Cited

U.S. PATENT DOCUMENTS

| | | | |
|---|---|---|---|
| 4,686,000 | 8/1987 | Heath | 438/702 |
| 4,855,017 | 8/1989 | Douglas | 438/695 |
| 5,338,700 | 8/1994 | Dennison et al. | 438/253 |
| 5,354,386 | 10/1994 | Cheung et al. | 148/33.3 |
| 5,401,681 | 3/1995 | Dennison | 438/253 |
| 5,541,132 | 7/1996 | Davies et al. | 438/231 |
| 5,562,801 | 10/1996 | Nulty | 438/695 |
| 5,563,089 | 10/1996 | Jost et al. | 438/396 |
| 5,567,270 | 10/1996 | Liu | 438/701 |
| 5,705,433 | 1/1998 | Olson et al. | 438/695 |
| 5,739,068 | 4/1998 | Jost et al. | 438/637 |
| 6,037,261 | 3/2000 | Jost et al. | 438/696 |

*Primary Examiner*—Benjamin L. Utech
*Assistant Examiner*—Donald L. Champagne
*Attorney, Agent, or Firm*—Wells, St. John, Roberts, Gregory & Matkin, P.S.

[57] ABSTRACT

A semiconductor processing method of making electrical contact to a node received within a mass of insulating dielectric material includes, a) providing a node within a mass of insulating dielectric material; b) first stage etching into the insulating dielectric material over the node in a manner substantially selective relative to the node; c) after the first stage etching, second stage etching the dielectric material in a manner which increases a degree of sidewall polymerization over that occurring in the first stage etching and in a manner substantially selective relative to the node; and d) after the second stage etching, third stage etching the dielectric material with a degree of sidewall polymerization which is less than that of the second stage etching and in a manner substantially selective relative to the first node. An alternate method provides an etch stop annulus cap 70 overlying an electrically conductive ring 62 which projects from a primary insulating layer 54. A secondary insulating 74 is then provided outwardly of the etch stop annulus cap. A second contact opening 76 is patterned and etched through the second insulating layer relative to the first contact opening and to the etch stop annulus cap, with the second contact opening having a wider target area 80 than would otherwise be provided if the annulus cap were not present. Aspects of the invention have significant utility in the fabrication of bit line over capacitor arrays of memory cells.

8 Claims, 8 Drawing Sheets

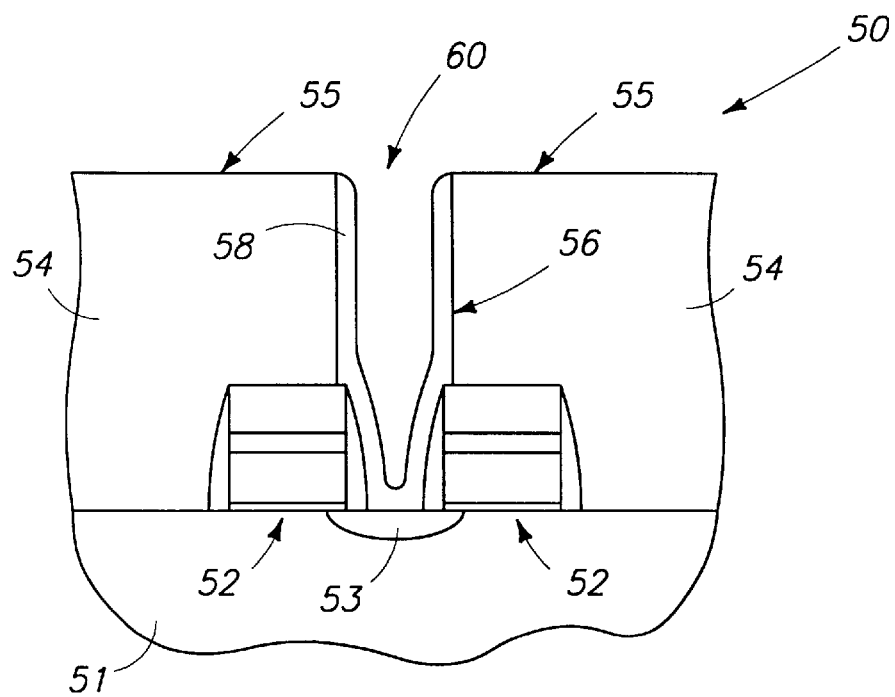
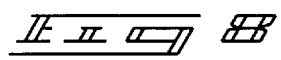
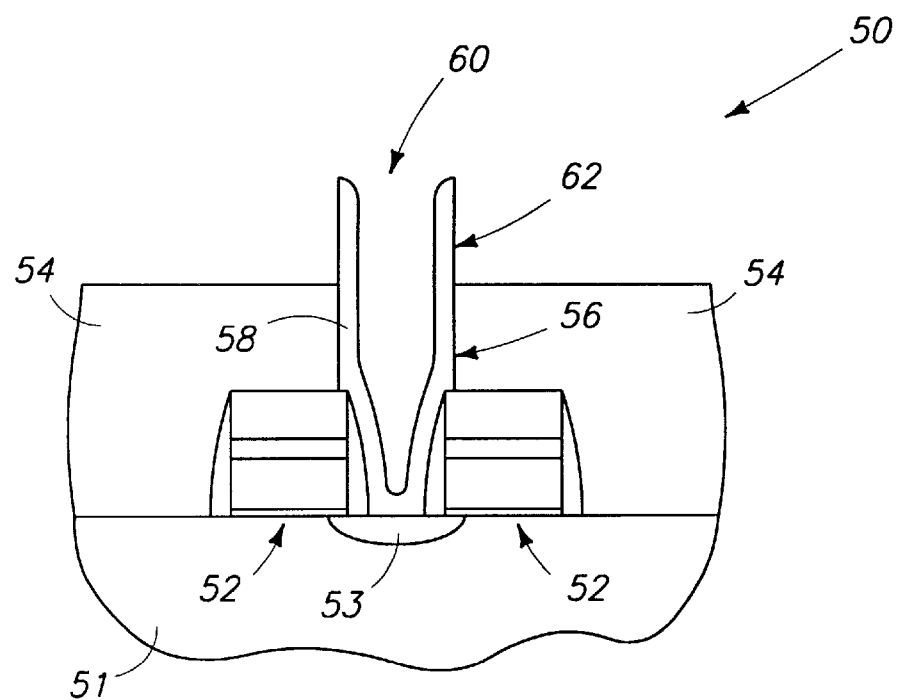
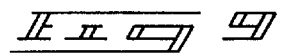

SEMICONDUCTOR PROCESSING METHOD OF MAKING ELECTRICAL CONTACT TO A NODE RECEIVED WITHIN A MASS OF INSULATING DIELECTRIC MATERIAL

RELATED PATENT DATA

This patent resulted from a continuation application of U.S. patent application Ser. No. 09/028,045, filed Feb. 23, 1998, and now U.S. Pat. No. 6,037,261; which is a continuation application of U.S. patent application Ser. No. 08/595,595, filed Feb. 2, 1996, and now U.S. Pat. No. 5,739,068, issued Apr. 14, 1998 which resulted from a continuation-in-part application of U.S. patent application Ser. No. 08/394,545, filed Feb. 22, 1995 and now U.S. Pat. No. 5,563,089.

TECHNICAL FIELD

This invention relates to semiconductor processing methods of making electrical contact to a node received within a mass of insulating dielectric material. Further, this invention relates to a semiconductor processing method of minimizing overetch risk resulting from mask misalignment relative to a first node received within a mass of insulating dielectric material when simultaneously etching over the first node in said insulating material and over a second node at a different and deeper elevation relative to said insulating material. More specifically, narrow aspects of the invention relate to fabrication of bit line over capacitor arrays of memory cells.

BACKGROUND OF THE INVENTION

As DRAMs increase in memory cell density, there is a continuing challenge to maintain sufficiently high storage capacitance despite a decreasing cell area. Additionally, there is a continuing goal to further decrease cell area. The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the word lines and bit lines. With non-buried bit line constructions, deep vertical contacts are made through a thick insulating layer to the cell FETs, with the capacitor constructions being provided over the word lines beneath the bit lines.

This invention arose out of concerns associated with forming bit line over capacitor arrays of memory cells, and particularly to a simultaneous etch of certain contact openings relative to both peripheral and memory array regions of such circuitry. The invention was motivated to making improvements for such contact etching relative to bit line over capacitor array circuitry of the parent application from which this patent application ultimately matured. However, the artisan will appreciate applicability of the developed technology to a other of semiconductor processing methods of making electrical contact to a node received within a mass of insulating dielectric material, with the invention only being limited by the accompanying claims appropriately interpreted in accordance with the Doctrine of Equivalents.

The prior problems associated with potential mask misalignment relative to simultaneous etching of four contacts will be readily appreciated from a description of the invention which follows.

BRIEF DESCRIPTION OF THE DRAWINGS

Preferred embodiments of the invention are described below with reference to the following accompanying drawings.

FIG. 8 is a view of the FIG. 6 wafer fragment at a processing step subsequent to that shown by FIG. 7.

FIG. 9 is a view of the FIG. 6 wafer fragment at a processing step subsequent to that shown by FIG. 8.

DETAILED DESCRIPTION OF THE PREFERRED EMBODIMENTS

Figure 1:
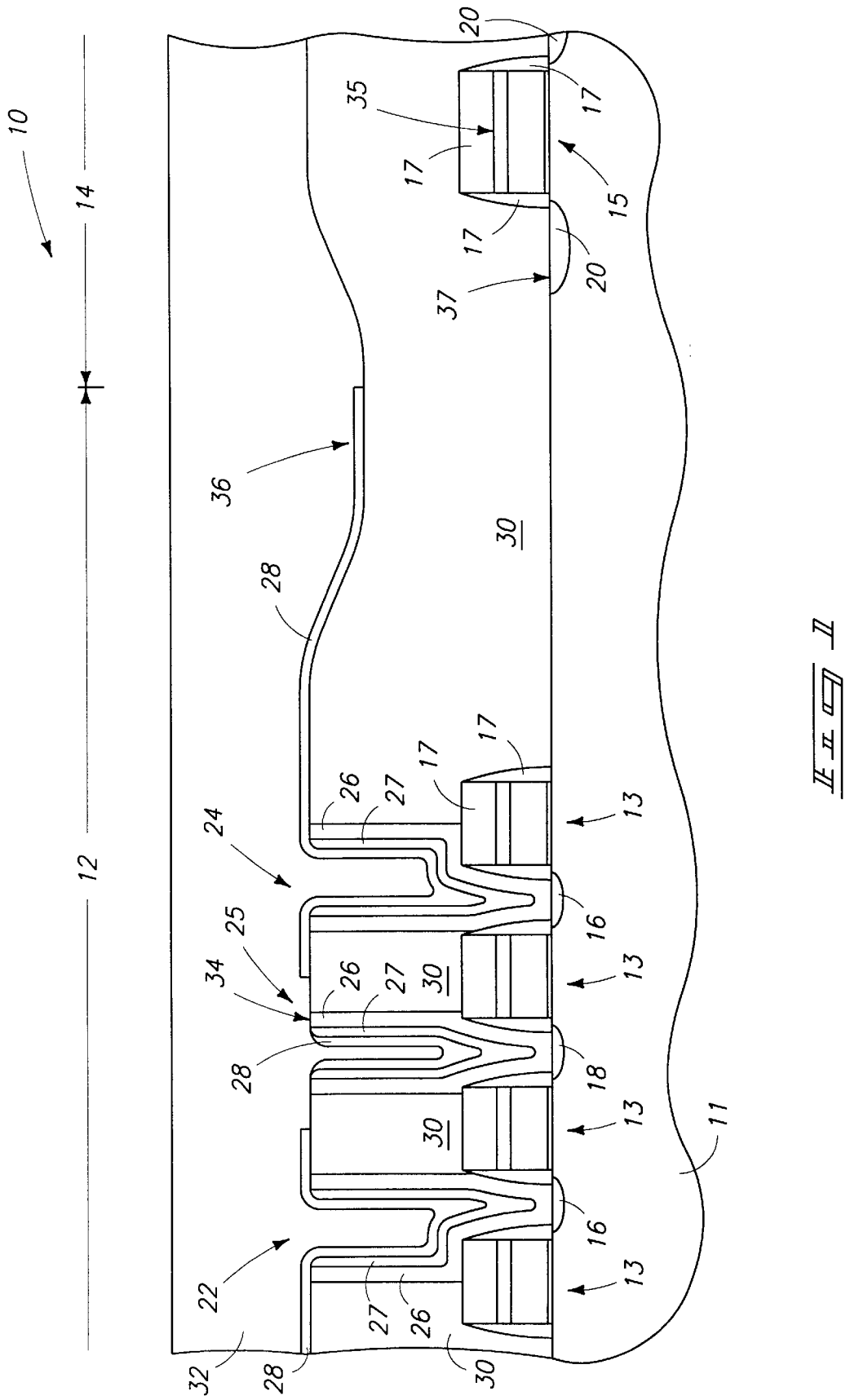
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of making electrical contact to a node received within a mass of insulating dielectric material comprises the following steps:

providing a node within a mass of insulating dielectric material;

first stage etching into the insulating dielectric material over the node in a manner substantially selective relative to the node;

after the first stage etching, second stage etching the dielectric material in a manner which increases a degree of sidewall polymerization over that occurring in the first stage etching and in a manner substantially selective relative to the node; and after the second stage etching, third stage etching the dielectric material with a degree of sidewall polymerization which is less than that of the second stage etching and in a manner substantially selective relative to the first node.

In accordance with another aspect of the invention, a semiconductor processing method of forming and electrically connecting to a node comprises the following steps:

providing a node to which electrical connection is to be made;

providing a primary insulating dielectric layer outwardly of the node, the primary insulating layer having an outer surface;

providing a first contact opening through the primary insulating dielectric layer to the node;

providing a first layer of electrically conductive material over the primary insulating layer and within the first contact opening which electrically connects with the node, the first layer being provided to a thickness which less than completely fills the first contact opening thereby leaving an outwardly open first void within the first contact opening;

removing first layer conductive material from outwardly of the primary insulating layer outer surface;

selectively etching the primary insulating layer selectively relative to the first layer of conductive material to outwardly expose sidewalls of the first layer of conductive material and form an electrically conductive ring projecting from the etched primary insulating layer;

providing a second layer of material outwardly of the electrically conductive ring and primary insulating layer and within the first void, the second layer being provided to a thickness which less than completely fills the first void thereby leaving an outwardly open second void within the first contact opening and defining an etch stop annulus cap overlying the electrically conductive ring;

providing a secondary insulating layer outwardly of the etch stop annulus cap; and patterning and etching a second contact opening through the second insulating layer relative to the first contact opening and to the etch stop annulus cap, the second contact opening having a wider target area than would otherwise be provided if the annulus cap were not present.

Referring to FIG. 1, a semiconductor wafer fragment in process for forming a bit line over capacitor array of memory cells is indicated generally with reference numeral 10. Such comprises memory array circuitry area 12 and peripheral circuitry area 14, formed relative to a monocrystalline silicon substrate 11. Array circuitry 12 includes a plurality of memory word lines 13 and associated diffusion regions 16 and 18. Periphery circuitry 14 includes an illustrated conductive line 15 having associated diffusion regions 20. The illustrated conductive lines are of a conventional construction having a lowermost gate oxide, a lower polysilicon layer, an overlying silicide layer such as tungsten silicide, and insulating caps and side insulating spacers 17. Such spacers and caps 17 preferably comprise an insulative nitride, such as $Si_3N_4$. A thin layer of $Si_3N_4$ (not shown) can be provided atop the wafer over the diffusion regions to function as a diffusion barrier. Isolating field oxide would be present, but is not shown for clarity of that which is pertinent to the invention.

Memory array diffusion regions 16 ohmically connect with respective capacitor constructions 22 and 24. A bit plug contact construction 25 is in ohmic electrical connection with diffusion region 18. Such are preferably fabricated in a manner similar to the parent disclosure, with the respective constructions constituting an inner polysilicon layer 26, an intervening dielectric layer 27, and an overlying conductive polysilicon layer 28. The illustrated constructions are received relative to a primary insulating layer 30, with polysilicon layer 28 having been patterned thereover as shown to define a patterned electrically conductive cell plate layer. A secondary insulating layer 32 is provided thereover and planarized, with layers 30 and 32 constituting insulating dielectric layer material provided outwardly of substrate 11 and the illustrated word line constructions.

The illustrated construction shows a singular layer 26 of polysilicon which has been deposited. Alternately, one or more layers of conductively doped polysilicon or other conductive materials can. constitute layer 26, with different varied dopant concentrations, as selected by the artisan processor. The same of course applies to layer 28. Further, depending upon photolithography etch or capacitance constraints, the dimensions of the illustrated capacitor constructions can either be the same size as that of the bit construction, or can be of different sizes. Preferably, the width of the storage and bit contacts within which the illustrated capacitor and bit contact constructions are received are of the same dimensions.

That portion of polysilicon layer 26 received outwardly of the primary insulating layer 30 can be removed either by CMP, dry etching using a blanket resist mask, or a directional dry etching with no photoresist. The latter two processes are preferred to preserve the depth of polysilicon within the container openings and bit contact. The dry etch with blanket resist mask process minimizes chance of damaging the junctions during any over-etching. Alternately to the process shown, primary insulating layer 30 could be etched prior to deposition of layers 27 and 28, thereby exposing outer sidewalls of layer 26. Regardless, the combined thicknesses of layers 26, 27 and 28 are preferably greater than one-half the spacing between the adjacent dielectric spacers of word lines 12 in the regions where the container and bit contact reach the silicon substrate surface. Thus, the cell plate poly 28 preferably completely fills the gap providing a poly plug etch stop for a bit contact etch which will be apparent subsequently. Cell plate poly layer 28 is preferably patterned with photoresist, and the cell plate polysilicon removed in the regions surrounding the lower portion of the bit contact structure.

For purposes of the continuing discussion, first, second, third and fourth nodes 34, 35, 36, 37, respectively, are provided relative to insulating dielectric material 30/32 for effective etching of such material utilizing a single photomasking process. First node 34 comprises a bit contact relative to array circuitry 12, which in the described and preferred embodiment comprises an electrically conductive annular ring formed within insulating dielectric material 30. Second node 35 comprises a conductive line contact to line 15 relative to peripheral circuitry 14, and is at a different and deeper elevation relative to insulating material 30/32 than first node 34. Third node 36 comprises a desired contact which will be made to capacitor cell plate layer 28 relative to array circuitry 12. In the depicted embodiment, node 36 is intermediate the elevations of nodes 34 and 35. Fourth node 37 comprises a bulk semiconductor substrate contact relative to peripheral. circuitry 14 which is at a different and deeper elevation relative to insulating material 30/32 than the first, second and third nodes.

Figure 2:
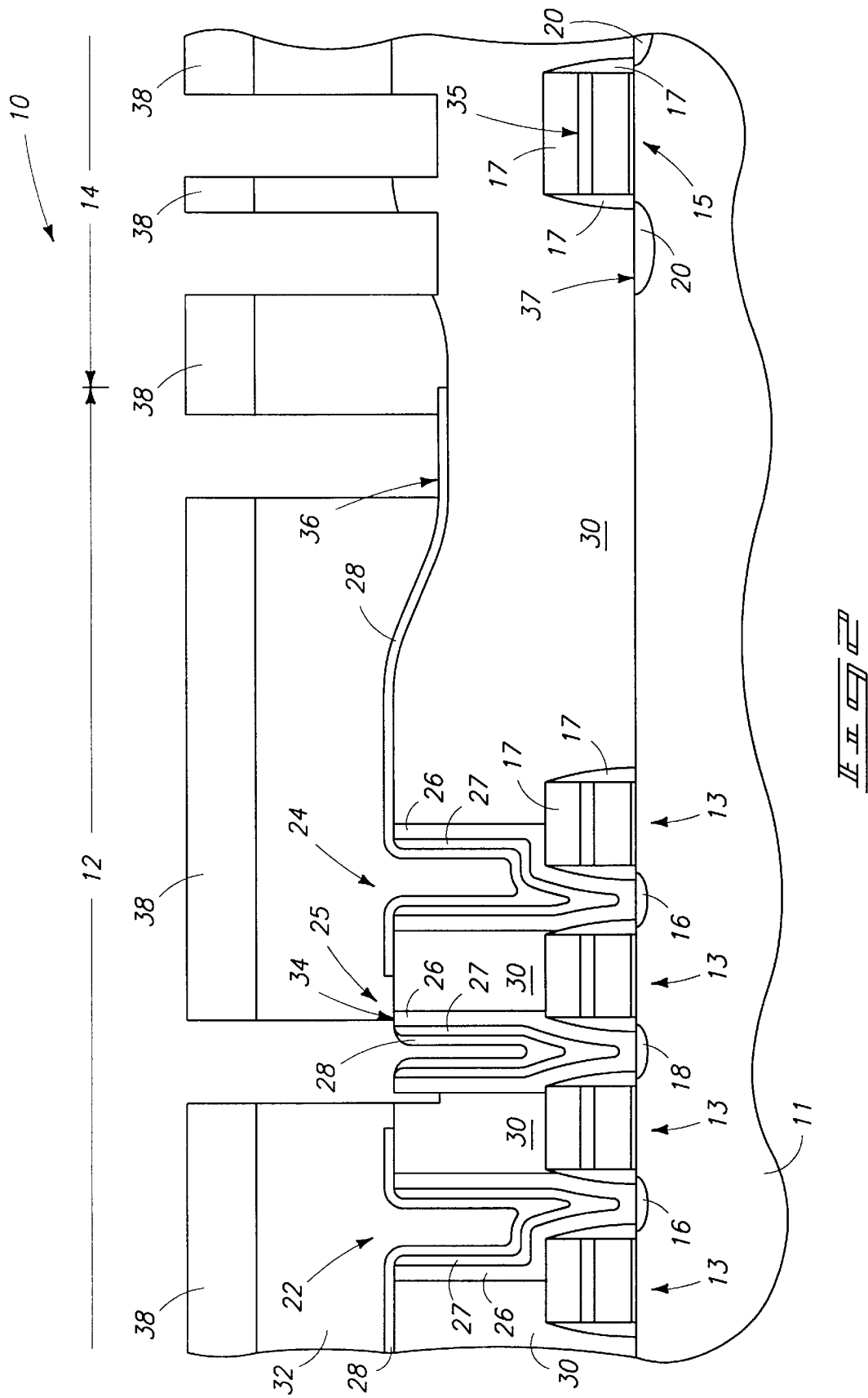
FIG. 2 is a view of the FIG. 1 wafer fragment at a processing step subsequent to that shown by FIG. 1.

Referring to FIG. 2, a layer 38 of photoresist has been deposited and patterned as shown for ultimate provision of contact openings through insulating material 30/32 over the respective first, second, third and fourth nodes. However, undesirably as shown, the mask has been slightly misaligned such that the contact opening over first node 34 overlaps to the left beyond the confines of such node. First stage etching is conducted into insulating dielectric material 30/32 over all of first node 34, second node 35, third node 36 and fourth node 37 in a manner substantially selective relative to first node 34. An example and preferred etch chemistry is a dry etch chemistry for the first stage etching, such as $CHF_3$/$CF_4$/Ar at volumetric ratios of 3:2:5, at a power of from 600 to 900 Watts, magnetic field at from 80 to 130 Gauss, lower electrode temperature at 20° C., and pressure of from 70 to 110 mTorr.

Such first stage etching at this point in the process is not inconsistent with or a departure from prior art methods of etching the illustrated four contact openings relative to memory and peripheral circuitry utilizing a common photomasking step. However, the prior art would continue such first stage etching in a manner which is highly selective to the silicon of first node 34 and third node 36 in order to achieve desired contact openings relative to second node 35 and fourth node 37. With the illustrated undesired misalignment of the mask, such would unfortunately also extend the far left FIG. 2 illustrated contact opening downwardly all the way to outwardly expose the conductive silicide of the word line 13 immediately to the left of first node 34, thus ultimately resulting in a fatal bit line to word line short. Accordingly in prior art methods, sophisticated enlarged targets for the bit contact or addition of intervening etch stop layers are utilized to account for the potential of such undesired mask misalignment.

In accordance with an aspect of the invention, the first stage etching is continued until exposing first node 34, but not second node 35 and fourth node 37. Preferably and typically, the first stage etching does outwardly expose third node 36.

Figure 3:
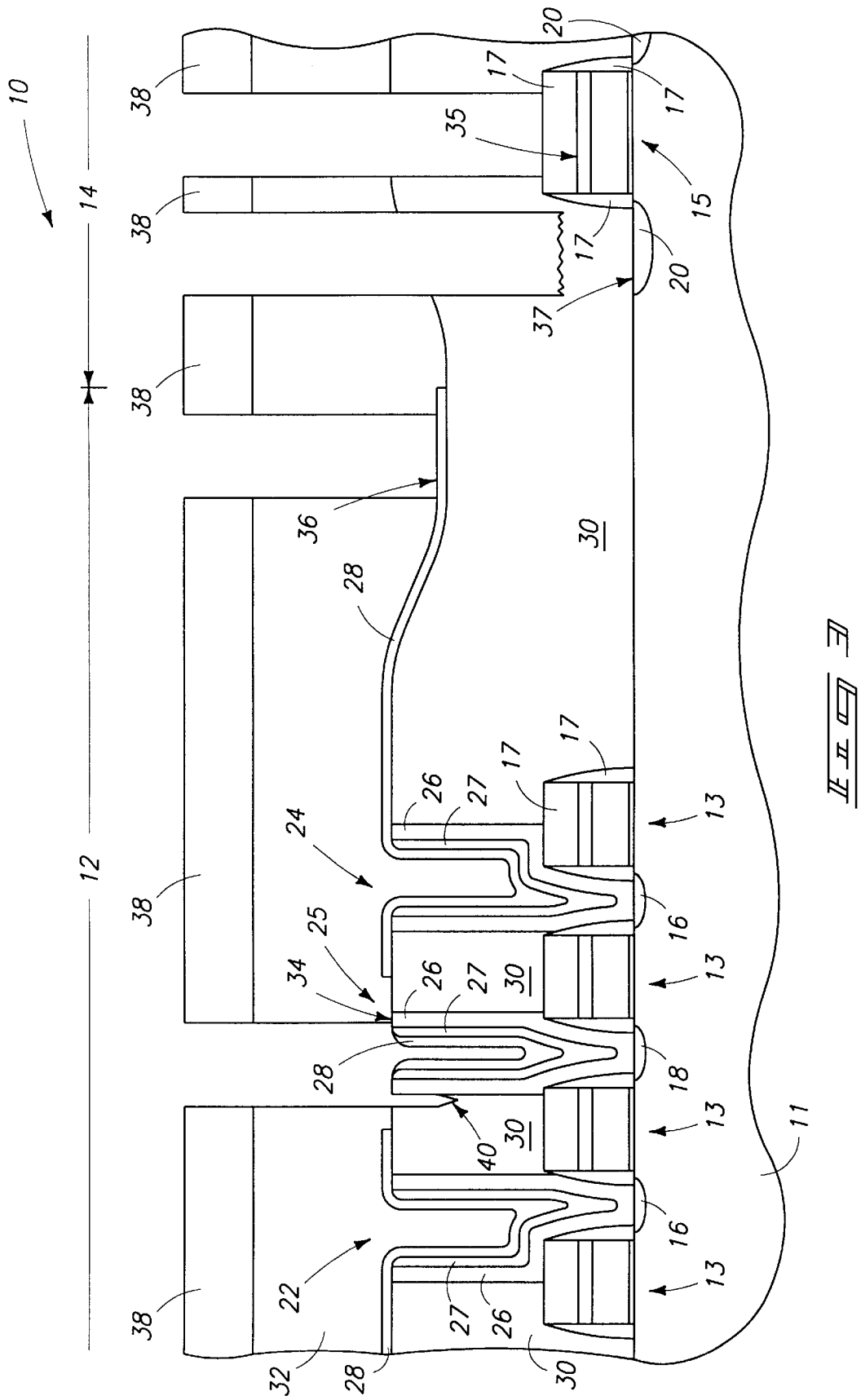
FIG. 3 is a view of the FIG. 1 wafer fragment at a processing step subsequent to that shown by FIG. 2.

Referring to FIG. 3 and after the first stage etching, second stage etching is conducted over all of the first, second, third and fourth s nodes in a manner substantially selective relative to first node 34 and third node 36, and in a manner which increases a degree of insulating material sidewall polymerization over that occurring in the first stage etching. Certain dry etch chemistries, such as those utilizing $CHF_3$ and $CF_4$, form polymers from such gases which have a tendency to create a polymer-lined sidewall within the opening of the insulating material being etched. Such polymer lining of the sidewalls greatly increases the anisotropic nature of the etch. The degree of polymerization can be controlled by varying the $CHF_3$:$CF_4$ ratio of the etching gases.

Higher degrees of polymerization do, however, have the adverse effect of slowing the overall etch rate of insulating material 30/32. However advantageously, such increase in degree of polymerization in the stated second stage etching does result in tapering and slowing of the etch within very narrow/high aspect ratio contacts, thus producing the illustrated taper and etch stopping at location 40 (FIG. 3). The illustrated second stage etching does not outwardly expose second node 35 and fourth node 37, but will expose third node 36 if such wasn't exposed by the first stage etching. The second stage etching can be conducted to the point and with a chemistry (such as those above) which effectively stops on nitride capping layer 17 over word line 15, as shown. Alternately, and more preferable, the etch can be stopped before reaching such capping layer.

One example and preferred etch chemistry for the second stage etching is $CHF_3$/$CF_4$/Ar at volumetric ratios of 4:2:5, at a power of from 400 to 550 Watts, magnetic field at from 50 to 100 Gauss, lower electrode temperature at 20° C., and pressure of from 150 to 225 mTorr. An alternate chemistry is $CHF_3$/$CF_4$/$CH_2F_2$/Ar at volumetric ratios of 4:6:3:18, at a power of from 400 to 500 Watts, magnetic field at from 50 to 100 Gauss, wafer temperature at 20° C., and pressure of from 150 to 225 mTorr. Greater polymerization can be achieved at higher electrode temperatures for the $CHF_3$/$CF_4$/$CH_2F_2$/Ar chemistry. Also preferably as shown, the etch over third node 36 stops relative to layer 28. Where etch through a thin layer 28 is a significant risk, an etch stop layer or structure can be utilized beneath layer 28 relative to substrate 11 to prevent a third opening etch thereto.

The intent of the increased polymerization in the second stage etching is to significantly retard, if not outright stop, the etching of the illustrated misalignment sliver. The narrower the sliver/higher the aspect ratio, the slower such will etch with a high polymerizing chemistry. The described multiple stage etching exploits the higher aspect ratio of a misalignment sliver, if any, compared to the desired contact openings being etched. Further, a sliver might not form until the second stage etching, depending upon the degree of first stage etching relative to the elevation where a sliver can form. Of course if there is perfect alignment, no sliver will form. Yet proceeding in the above and. claimed manner obviates or at least alleviates risk of fatal sliver etching to unintended circuitry below.

Figure 4:
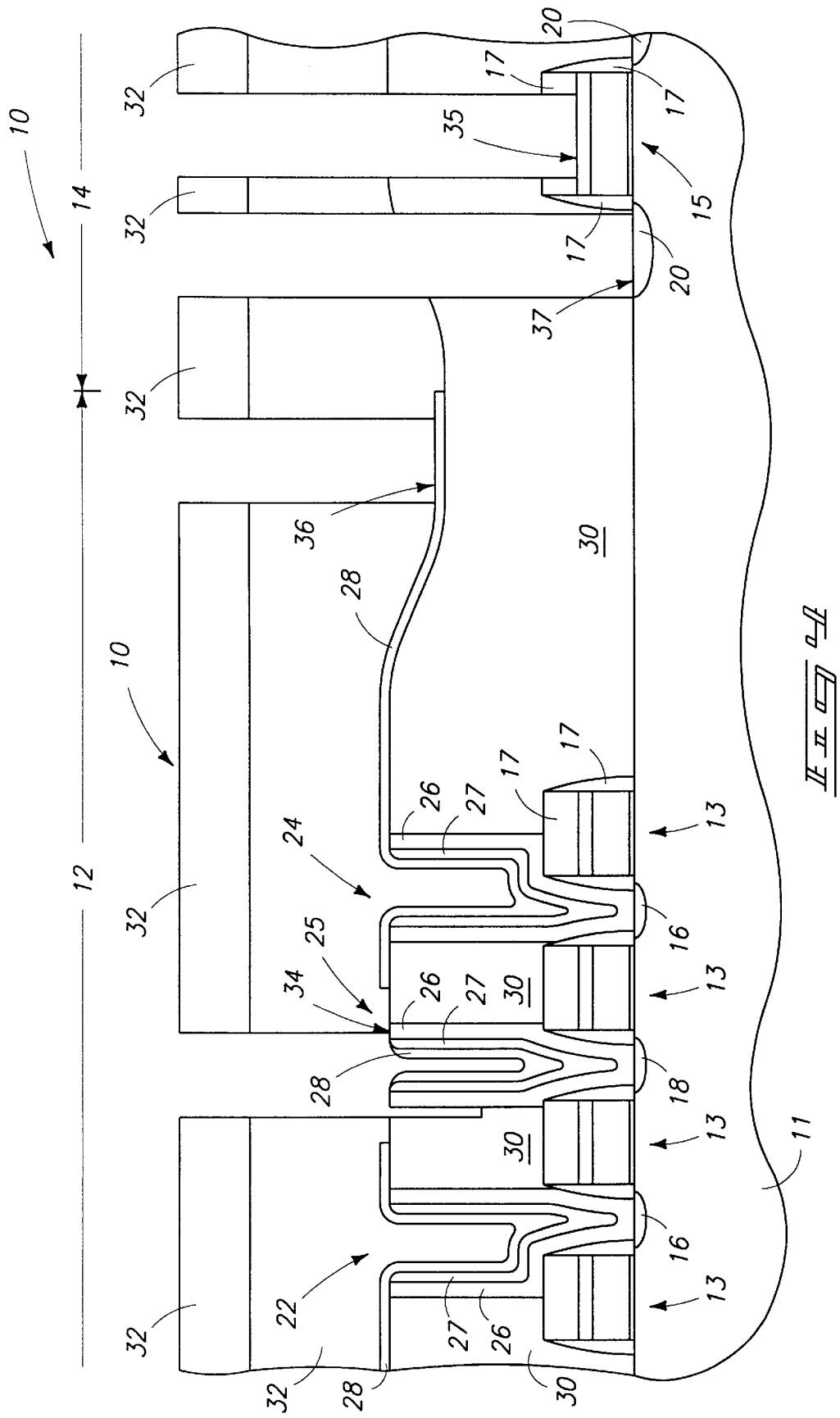
FIG. 4 is a view of the FIG. 1 wafer fragment at a processing step subsequent to that shown by FIG. 3.

Referring to FIG. 4 and after completion of the second stage: etching, third stage etching is conducted over all of the first, second, third and fourth nodes in a manner substantially selective relative to the first, second, third and fourth nodes. Such etching is also conducted. with a degree of insulating material sidewalls polymerization which is less than that of the second stage etching, with the third stage etching being conducted until outwardly exposing second node 35 and fourth node 37 as shown. Preferably and advantageously for simplicity, the third stage etch chemistry is identical to the first. Depending on the extent of polymer buildup in the misaligned overetch sliver at 40, such an etch may result in some further etching in the far left illustrated. misaligned contact. Yet such should not be sufficiently great or for such an extended period of time to etch all the way to outwardly expose a memory array word line.

Figure 5:
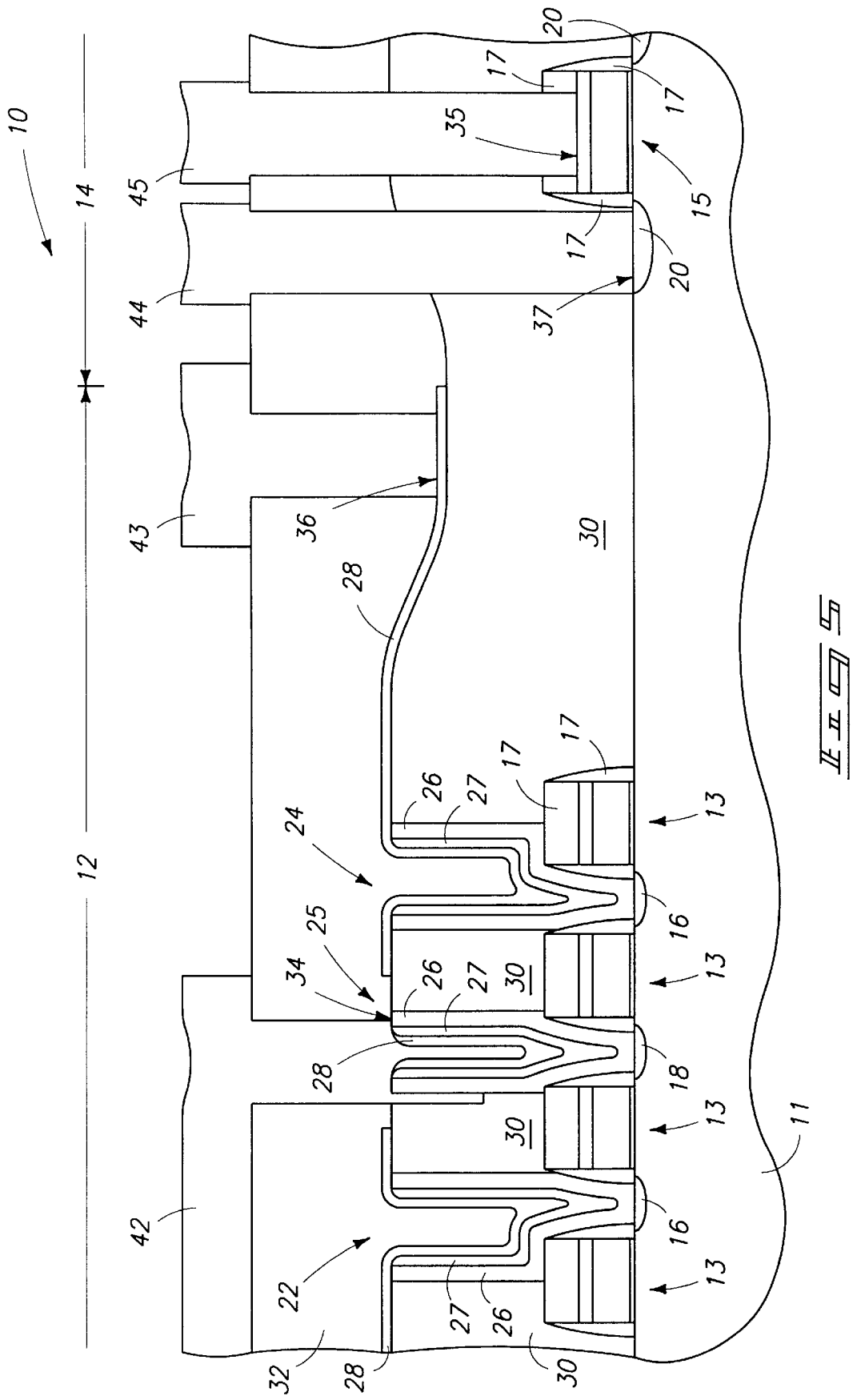
FIG. 5 is a view of the FIG. 1 wafer fragment at a processing step subsequent to that shown by FIG. 4.

Referring to FIG. 5, a layer of electrically conductive material is, deposited to fill such contact openings, and patterned to form the illustrated bit line 42 and other desired interconnect lines 43, 44, and 45.

The above-described preferred process was described relative to formation of a bit line over capacitor array of word line cells, and in conjunction with the etching of four contact openings to different circuitry components utilizing a single photomasking step. The artisan will, however, appreciate applicability of the invention to other semiconductor processing methods where it is desirable to minimize overetch risk resulting from mask misalignment relative to a first node at one elevation and a second node at a different and deeper elevation relative to a mass of insulating material. Further, the artisan will appreciate applicability of the invention to making electrical contact to even a single node within a mass of insulating material, such as etching singularly to the subject bit contact of the above-described embodiment.

Figure 6:
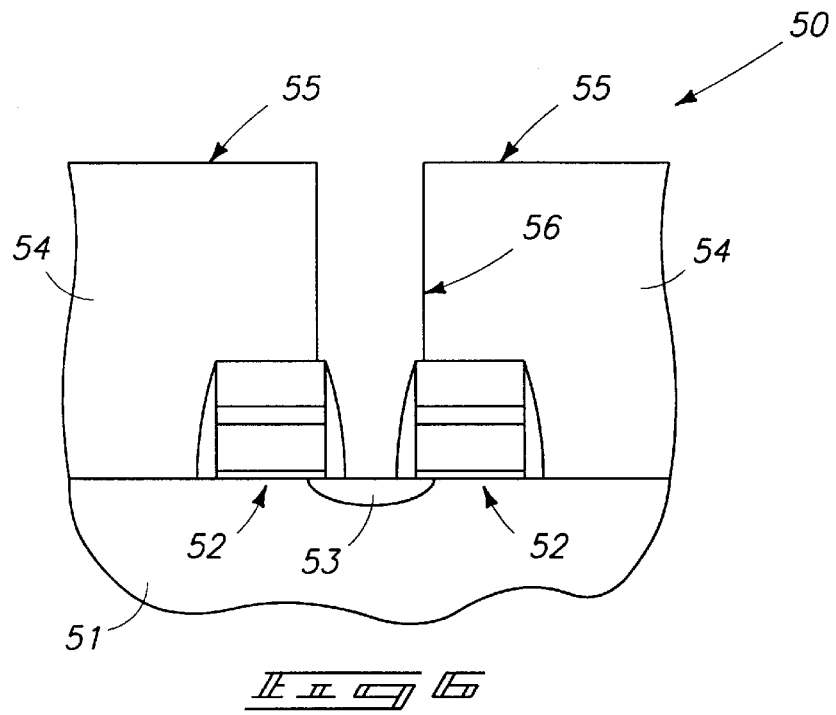
FIG. 6 is a diagrammatic sectional view of an alternate embodiment semiconductor wafer fragment at one alternate processing step in accordance with the invention.

An alternate semiconductor processing method of forming and electrically connecting to a node is described with reference to FIGS. 6–11. FIG. 6 illustrates a semiconductor wafer fragment 50 comprised of a bulk monocrystalline silicon substrate 51 having a pair of word lines 52 and an intervening diffusion region 53. In this described preferred embodiment, diffusion region 53 constitutes a bit node of a DRAM array to which electrical connection is to be made. A primary insulating dielectric layer 54, having an outer surface 55, is provided outwardly of node 53 and word lines 52. A first contact opening 56 is provided through primary insulating dielectric layer 54 to node 53.

Figure 7:
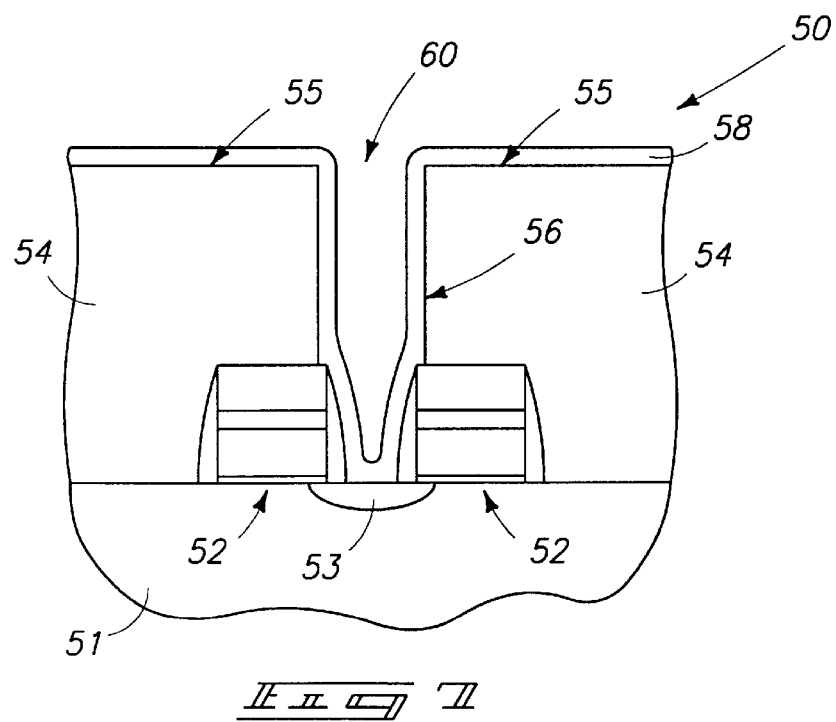
FIG. 7 is a view of the FIG. 6 wafer fragment at a processing step subsequent to that shown by FIG. 6.

Referring to FIG. 7, a first layer of electrically conductive material 58 is provided over primary insulating layer 54 and within first contact opening 56 and which electrically and ohmically connects with node 53. First conductive layer 58 is provided to a thickness which less than completely fills first contact opening 56, thereby leaving an outwardly opening first void 60 within first contact opening 56.

Referring to FIG. 8, the first layer of conductive material is removed from outwardly of primary insulating layer outer surface 55. One example technique for doing so is chemical-mechanical polishing.

Referring to FIG. 9, primary insulating layer 54 is selectively etched relative to first conductive material layer 58 to outwardly expose sidewalls thereof, and effectively form an electrically conductive ring 62 projecting from etched primary insulating layer 54.

Figure 10:
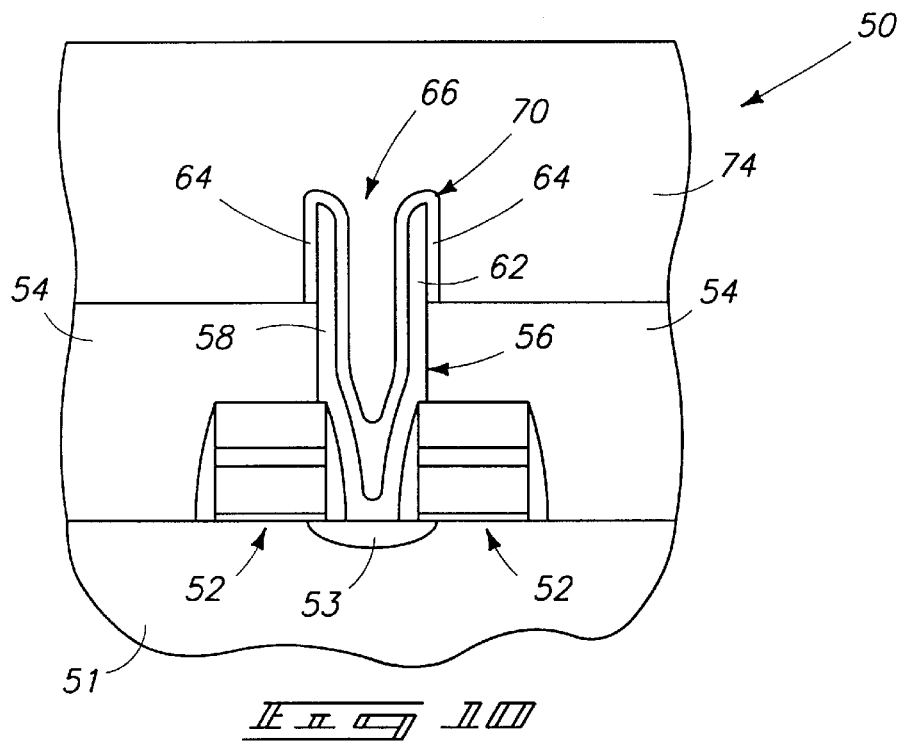
FIG. 10 is a view of the FIG. 6 wafer fragment at a processing step subsequent to that shown by FIG. 9.

Referring to FIG. 10, a second layer 64 of material is provided outwardly of electrically conductive ring 62, and primary insulating layer 54, and within first void 60. Second layer 64 is provided to a thickness which less than completely fills first void 60, thereby leaving an outwardly open second void 66 within or relative to first contact opening 56. In accordance with the above-described first embodiment, an intervening capacitor dielectric layer might have been previously provided over projecting ring 62 prior to provision of layer 64. Regardless, a preferred material of construction for layer 64 is conductively doped polysilicon. Where no intervening capacitor dielectric layer is provided, conductive layer 64 is thereby provided to be in ohmic electrical connection with first electrically conductive layer 58. Second layer of material 64 is then etched as shown to define an etch stop annulus cap 70 overlying electrically conductive ring 62. Subsequently, a secondary insulating later 74 is provided outwardly of etch stop annulus cap 70.

Figure 11:
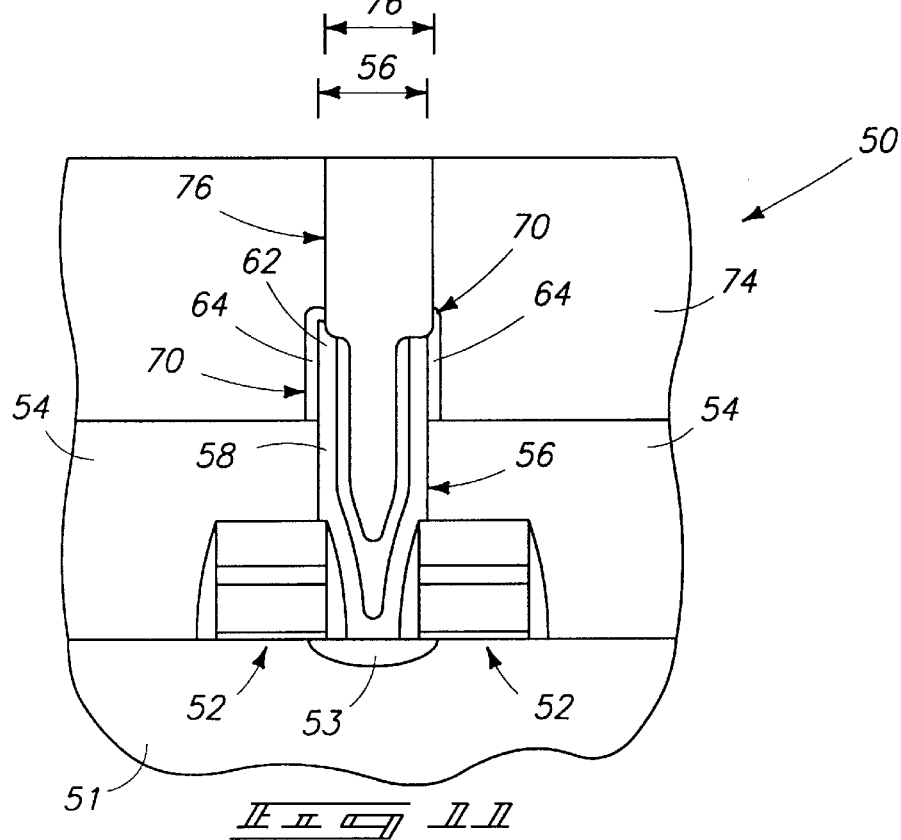
FIG. 11 is a view of the FIG. 6 wafer fragment at a processing step subsequent to that shown by FIG. 10.

Referring to FIG. 11, a second contact opening 76 is patterned and etched through second insulating layer 74 relative to first contact opening 56 and to etch stop annulus cap 70. As is readily apparent:, second contact opening 76 is provided with a wider or greater target area 80 than would otherwise be provided if annulus cap 70 were not present. Without annulus cap 70, the effective target area is essentially the confines of first contact opening width 56.

In the FIG. 11 illustrated embodiment, second contact opening 76 is illustrated as being slightly misaligned relative to first contact opening 56, but still within the confines of widened target area 80. Where no intervening dielectric layer exists between etch stop annulus cap 70 and underlying electrically conductive ring 66, no further etching is desired. However, where an intervening layer of electrically insulated material exists, further etching is preferably conducted at this point through etch stop annulus cap 70, as shown, to outwardly expose electrically conductive ring 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   providing a node within a dielectric material, the node comprising an electrically conductive annular ring formed within the dielectric material;
   first stage etching into the dielectric material proximate the node;
   after the first stage etching, second stage etching the dielectric material in a manner which increases a degree of sidewall polymerization over that occurring in the first stage etching; and
   after the second stage etching, third stage etching the dielectric material with a degree of sidewall polymerization which is less than that of the second stage etching.

2. A semiconductor processing method comprising:
   providing a node within a dielectric material, the node comprising an electrically conductive annular ring formed within the dielectric material;
   first stage etching into the dielectric material proximate the node, the first stage etching being conducted at least until outwardly exposing the node;
   after the first stage etching, second stage etching the dielectric material in a manner which increases a degree of sidewall polymerization over that occurring in the first stage etching; and
   after the second stage etching, third stage etching the dielectric material with a degree of sidewall polymerization which is less than that of the second stage etching.

3. A semiconductor processing method of forming and electrically connecting to a node comprising:
   providing a node to which electrical connection is to be made;
   providing a first insulating layer outwardly of the node, the first insulating layer having an outer surface;
   providing a first opening through the first insulating layer to the node;
   providing a first layer of electrically conductive material over the first insulating layer and within the first opening to electrically connect with the node, the first layer being provided to a thickness which less than completely fills the first opening thereby leaving an outwardly open first void within the first opening;
   removing first layer conductive material from outwardly of the first insulating layer outer surface;
   removing a portion of the first insulating layer to outwardly expose; sidewalls of the first layer of conductive material and form an electrically conductive ring projecting from the etched first insulating layer;
   providing a second layer of material outwardly of the electrically conductive ring and first insulating layer and within the first void, the second layer being provided to a thickness which less than completely fills the first void thereby leaving an outwardly open second void within the first opening and defining an etch stop annulus cap overlying the electrically conductive ring;
   providing a second insulating layer outwardly of the etch stop annulus cap; and
   patterning and etching a second opening through the second insulating layer to the etch stop annulus cap, the second opening having a wider target area than would otherwise be provided if the annulus cap were not present.

4. The semiconductor processing method of claim 3 further comprising etching through the etch stop annulus cap to outwardly expose the electrically conductive ring.

5. The semiconductor processing method of claim 3 wherein the second layer material is provided to be electrically conductive.

6. The semiconductor processing method of claim 3 wherein the second layer material is provided to be electrically conductive and in ohmic electrical connection with the first electrically conductive layer.

7. The semiconductor processing method of claim 3 wherein the second layer material is provided to be electrically conductive, and further comprising etching through the etch stop annulus cap to outwardly expose the electrically conductive ring.

8. The semiconductor processing method of claim 3 wherein the second layer material is provided to be electrically conductive and in ohmic electrical connection with the first electrically conductive layer, and further comprising etching through the etch stop annulus cap to outwardly expose the electrically conductive ring.

* * * * *

UNITED STATES PATENT AND TRADEMARK OFFICE
CERTIFICATE OF CORRECTION

PATENT NO : 6,153,527
DATED : November 28, 2000
INVENTOR(S) : Mark E. Jost et al.

It is certified that error appears in the above-identified patent and that said Letters Patent are hereby corrected as shown below:

In the Abstract please delete "70".

In the Abstract please delete "62".

In the Abstract please delete "54".

In the Abstract please replace "74" with --layer--.

In the Abstract please delete "76".

In the Abstract please delete "80".

Col. 5, line 25 please delete "s".

Signed and Sealed this

First Day of May, 2001

NICHOLAS P. GODICI

*Attest:*

*Attesting Officer*     *Acting Director of the United States Patent and Trademark Office*